United States Patent [19]

Badalec et al.

[11] Patent Number: 4,746,390

[45] Date of Patent: May 24, 1988

[54] METHOD FOR JOINING A SEMICONDUCTOR CHIP TO A CHIP CARRIER

[75] Inventors: Radim Badalec; Werner Baumgartner; David Cutter, all of Munich, Fed. Rep. of Germany

[73] Assignee: Siemens Aktiengesellschaft, Berlin and Munich, Fed. Rep. of Germany

[21] Appl. No.: 402,847

[22] Filed: Jul. 29, 1982

[30] Foreign Application Priority Data

Aug. 20, 1981 [DE] Fed. Rep. of Germany ....... 3132983

[51] Int. Cl.⁴ .............................................. B29C 65/16
[52] U.S. Cl. .................. 156/272.8; 156/196; 219/121 LF; 219/121 LL; 427/53.1
[58] Field of Search .......... 156/64, 272-278, 156/153, 155, 196, 643; 29/582, 890; 219/121 LE, 121 LS, 121 LG, 121 LF, 121 LH, 121 LJ, 121 LK, 121 LL, 121 LN; 427/53.1

[56] References Cited

U.S. PATENT DOCUMENTS

| | | | |
|---|---|---|---|
| 3,945,111 | 3/1976 | Greeson et al. | 29/590 |
| 4,028,523 | 6/1977 | Anderl et al. | 219/121 LJ |
| 4,050,507 | 9/1977 | Chu et al. | 219/121 LL |
| 4,200,382 | 4/1980 | Friedman | 354/304 |
| 4,257,827 | 3/1981 | Schwuttke et al. | 219/121 LE |
| 4,288,678 | 9/1981 | La Rocca | 219/121 LE |
| 4,360,965 | 11/1982 | Fujiwara | 29/582 |

OTHER PUBLICATIONS

Levy et al., "Interfacial Bonding of Nickel to Polyamide-Imide", 6/79, pp. 68-71.
IEEE-Spectrum, May 1978, pp. 42-49.

*Primary Examiner*—Merrell C. Cashion, Jr.
*Attorney, Agent, or Firm*—Herbert L. Lerner; Laurence A. Greenberg

[57] ABSTRACT

Method of joining a semiconductor chip to a chip carrier by cementing or soldering which includes treating an area of the semiconductor chip to be joined to the carrier with a laser beam, adjusting the energy of the laser beam to produce depressions by localizing melting of the semiconductor material of the chip and to at least partially pile melted semiconductor material at the edge of the depression, and applying cement or solder between the treated area of the semiconductor chip and the carrier.

6 Claims, 1 Drawing Sheet

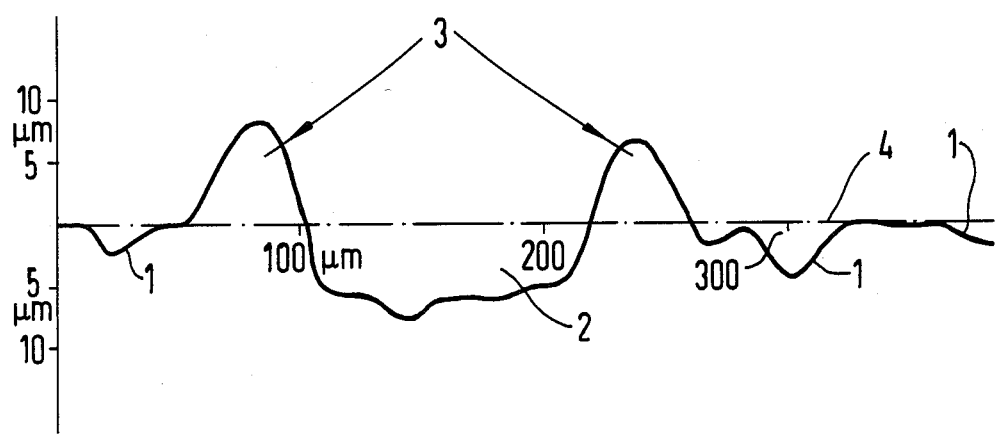

METHOD FOR JOINING A SEMICONDUCTOR CHIP TO A CHIP CARRIER

The invention relates to a method for joining a semiconductor chip to a chip carrier by cementing or soldering.

Semiconductor chips, such as integrated semiconductor circuits or power components, are soldered or cemented on one side thereof to metallic carrier plates or metallized ceramic carrier plates. The solder or cementing joint must be so mechnically durable that it is not destroyed by frequent load changes and shear stresses between the semiconductor chip and the chip carrier connected thereto. Since the chip carrier either additionally serves as a heat sink or must conduct the heat to a heat sink, a low reproducible thermal transfer resistance between the semiconductor chip and the chip carrier, which is as low as possible, is also desired.

It is accordingly an object of the invention to provide a method for joining a semiconductor chip to a chip carrier, which overcomes the hereinafore-mentioned disadvantages of the heretofore-known methods of this general type, ad through which optimum durability of the joint can be achieved with a simultaneous low and reproducible thermal transfer resistance.

With the foregoing and other objects in view there is provided, in accordance with the invention, a method for joining a semiconductor chip to a chip carrier by cementing or soldering, which comprises treating an area of the semiconductor chip to be joined to the carrier with a laser beam, adjusting the energy of the laser beam to produce depressions by localized melting of the semiconductor material of the chip and to at least partially pile up or throw melted semiconductor material at the edge of the depression, and applying cement or solder between the treated area of the semiconductor chip and the carrier.

In accordance with another mode of the invention, there is provided a method which comprises forming the depression with a diameter of between 50 and 200 $\mu$m and a depth of between 2 and 10 $\mu$m, and piling the semiconductor material ejected from the depressions at a height of between 2 and 10 $\mu$m.

In accordance with a further mode of the invention, there is provided a method which comprises using a pulsed Nd:YAG laser for treating the area of the chip to be joined.

In accordance with an added mode of the invention, there is provided a method which comprises performing the melting step in a protective or reactive gas atmosphere.

In accordance with a concomitant mode of the invention, there is provided a method which comprises metallizing the area of the semiconductor chip to be joined after the laser treatment.

Other features which are considered as characteristic for the invention are set forth in the appended claims.

Although the invention is illustrated and described herein as embodied in method for joining a semiconductor chip to a chip carrier, it is nevertheless not intended to be limited to the details shown, since various modifications may be made therein without departing from the spirit of the invention and within the scope and range of equivalents of the claims.

The invention, however, together with additional objects and advantages thereof, will be best understood from the following description of specific embodiments when read in connection with the accompanying single FIGURE of the drawing which is a cross-sectional view through a crater produced in a semiconductor chip according to the invention in order to explain several process parameters.

After the usual process steps such as impantation, diffusion and etching etc., the semiconductor chips are treated with a laser beam on the side thereof which is to be joined to the chip carrier. This laser beam may come from a pulsed Nd:YAG laser (Neodymium:Yitrium-Aluminum-Granate) for example. The energy supplied to the laser is adjusted in such a way that the laser beam produces craters of from 2 to 10 $\mu$m deep on the surface of the semiconductor wafer, such as a silicon semiconductor wafer. The diameter of the craters may, for instance, be between 50 and 200 $\mu$m. This result can be obtained with a power of 50 W supplied to the laser and a frequency of approximately 4 kHz. If the laser strikes the silicon surface, silicon is melted and is ejected from the crater. All around the crater, a mound which is likewise about 2 to 10 $\mu$m is formed. The melting can be performed in a protective gas such as argon or nitrogen or in a reactive gas such as oxygen.

The resulting cross section through such a crater is shown in the FIGURE of the drawing. The contour of the remaining silicon surface is designated with reference numeral 1. The crater which is produced has refernce numeral 2 while the mound at the edge of the depression is designated with reference numeral 3. The depth of the depression and the height of the mound are measured in this case from an imaginary line 4 which lies over the maxima of the original silicon surface. The width and the diameter of the depression should be measured at the height or level of the imaginary plane.

In order to obtain a good joint between the semiconductor chip and the chip carrier, the ratio of the area of all of the depressions 2 relative to the area of the semiconductor chip which is not treated by the laser, should be at least about 30%. This produces a good bite of the solder or the adhesive with the surface of the semiconductor chip and a good connection between the semiconductor chip and the chip carrier. The mound 3 assures that a defined distance between the semiconductor chip and the chip carrier will be provided so that the thermal transfer resistance is accurately reproducible. The remaining voids between the semiconductor chip and the chip carrier are then filled with the conductive adhesive or the solder. Advantageously, the entire area of the semiconductor chip to be joined is metallized prior to soldering or cementing. In this case, the thermal transfer resistance can be reduced and the electrical contact can be improved.

There are claimed:

1. Method of joining a semiconductor chip to a chip carrier by cementing or soldering, which comprises treating an area of the semiconductor chip to be joined to the carrier with a laser beam, adjusting the energy of the laser beam to produce depressions in the semiconductor chip by localized melting of the semiconductor material of the chip and to at least partially pile melted semiconductor material on the surface of the semiconductor chip at the edge of the depression, and applying cement or solder between the treated area of the semiconductor chip containing the depressions and the piled material and the carrier.

2. Method according to claim 1, which comprises forming the depressions with a diameter of between 50 and 200 $\mu$m and a depth of between 2 and 10 $\mu$m, and piling the semiconductor material ejected from the depressions at a height of between 2 and 10 μm.

3. Method according to claim 1 or 2, which comprises using a pulsed Nd:YAG laser for treating the area of the chip to be joined.

4. Method according to claim 1, which comprises performing the melting step in a protective gas atmosphere.

5. Method according to claim 1, which comprises performing the melting step in a reactive gas atmosphere.

6. Method according to claim 1, which comprises metallizing the area of the semiconductor chip to be joined after the laser treatment.

* * * * *